US009475691B1

(12) United States Patent
Chua et al.

(10) Patent No.: US 9,475,691 B1
(45) Date of Patent: Oct. 25, 2016

(54) MOLDED PACKAGE STRUCTURE WITH GLUE BLEED STOPPER FOR SEALING A MEMS DEVICE METHOD OF PACKAGING A MEMS DEVICE

(71) Applicant: Infineon Technologies AG, Neubiberg (DE)

(72) Inventors: Kok Yau Chua, Melaka (MY); Sook Woon Chan, Melaka (MY); Chau Fatt Chiang, Melaka (MY); Stefan Martens, Munich (DE); Matthias Steiert, Ehrenkirchen (DE); Kian Hong Yeo, Melaka (MY); Hock Siang Chua, Johor (MY); Mei Chin Ng, Melaka (MY); Swee Kah Lee, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/751,316

(22) Filed: Jun. 26, 2015

(51) Int. Cl.
| | | |
|---|---|---|
| *H01L 23/495* | (2006.01) | |
| *B81B 7/00* | (2006.01) | |
| *B81C 1/00* | (2006.01) | |

(52) U.S. Cl.
CPC .......... *B81B 7/0064* (2013.01); *B81B 7/0032* (2013.01); *B81B 7/0048* (2013.01); *B81B 7/0051* (2013.01); *B81B 7/0061* (2013.01); *B81C 1/00333* (2013.01); *H01L 23/495* (2013.01); *H01L 23/4951* (2013.01); *H01L 23/49503* (2013.01); *H01L 23/49575* (2013.01); *B81B 2201/0257* (2013.01); *B81B 2203/0315* (2013.01); *B81B 2207/093* (2013.01); *B81C 2203/0154* (2013.01); *B81C 2203/032* (2013.01)

(58) Field of Classification Search
None
See application file for complete search history.

(56) References Cited

U.S. PATENT DOCUMENTS

| | | | | |
|---|---|---|---|---|
| 6,384,472 B1* | 5/2002 | Huang | ..................... | H01L 21/50 257/676 |
| 7,781,852 B1* | 8/2010 | Faheem | ............... | G01L 19/0636 257/419 |
| 2011/0193184 A1* | 8/2011 | Solf | ........................ | B81B 7/0016 257/417 |
| 2012/0043628 A1* | 2/2012 | Martin | ................... | B81B 7/0048 257/416 |
| 2012/0104629 A1 | 5/2012 | Bolognia et al. | | |
| 2012/0250925 A1 | 10/2012 | Lillelund et al. | | |
| 2014/0008737 A1 | 1/2014 | Koduri et al. | | |
| 2014/0037120 A1 | 2/2014 | Lim et al. | | |
| 2014/0070382 A1 | 3/2014 | Goida et al. | | |
| 2014/0117473 A1 | 5/2014 | Kierse et al. | | |

FOREIGN PATENT DOCUMENTS

| | | |
|---|---|---|
| DE | 102014100755 A1 | 7/2014 |
| DE | 102014108951 A1 | 7/2014 |
| WO | 2010047056 A1 | 4/2010 |

\* cited by examiner

*Primary Examiner* — Minh-Loan Tran
(74) *Attorney, Agent, or Firm* — Murphy, Bilak & Homiller, PLLC

(57) ABSTRACT

A semiconductor package includes an electrically conductive lead-frame, including a first die paddle having a first opening, and a plurality of electrically conductive leads, a ridge formed around a perimeter of the first opening, and an electrically insulating molding compound. The electrically insulating molding compound includes an interior cavity being defined by a planar base surface and outer sidewalls, a second opening formed in the base surface, and an interior sidewall within the interior cavity. The molding compound is formed around the lead-frame with the first die paddle in the interior cavity. The first and second openings are aligned with one another so as to form a port that provides access to the interior cavity. The ridge and the interior sidewall form a dam that is configured to collect liquefied sealant and prevent the liquefied sealant from overflowing into the port or into adjacent regions of the interior cavity.

20 Claims, 12 Drawing Sheets

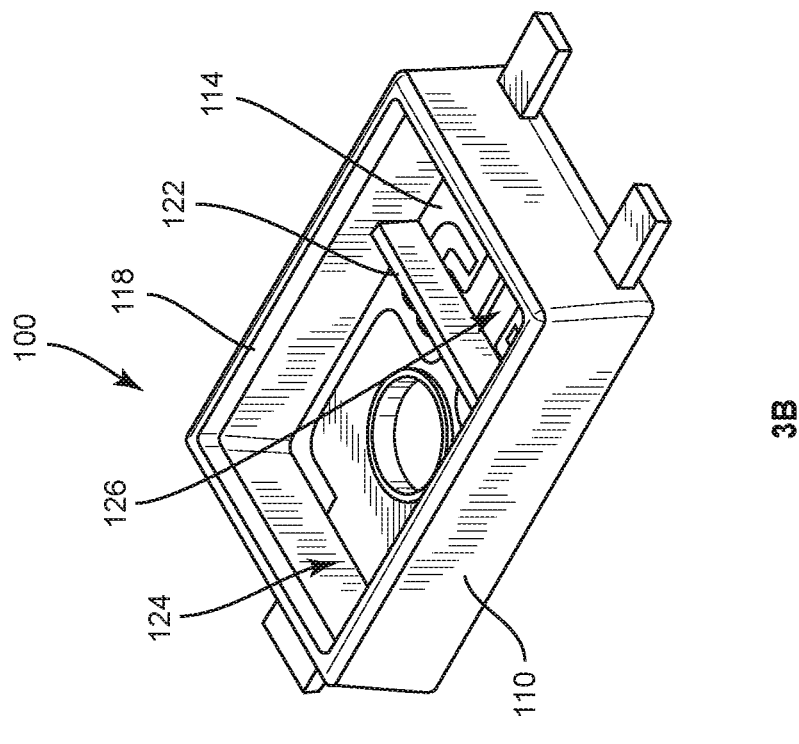
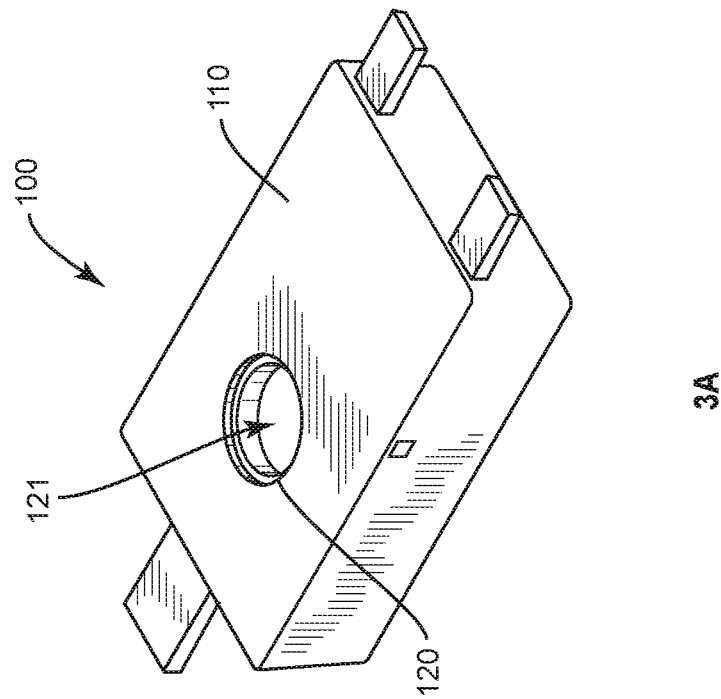
FIGURE 3

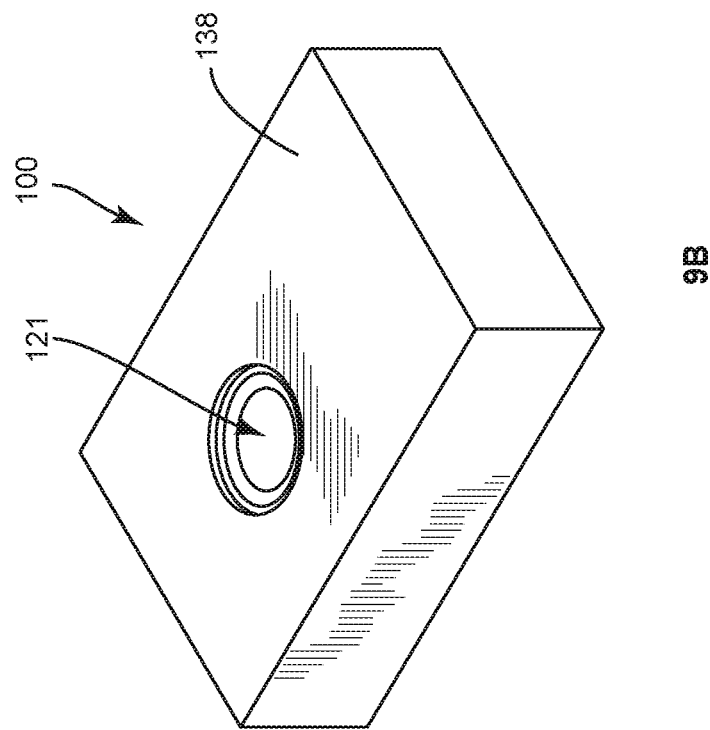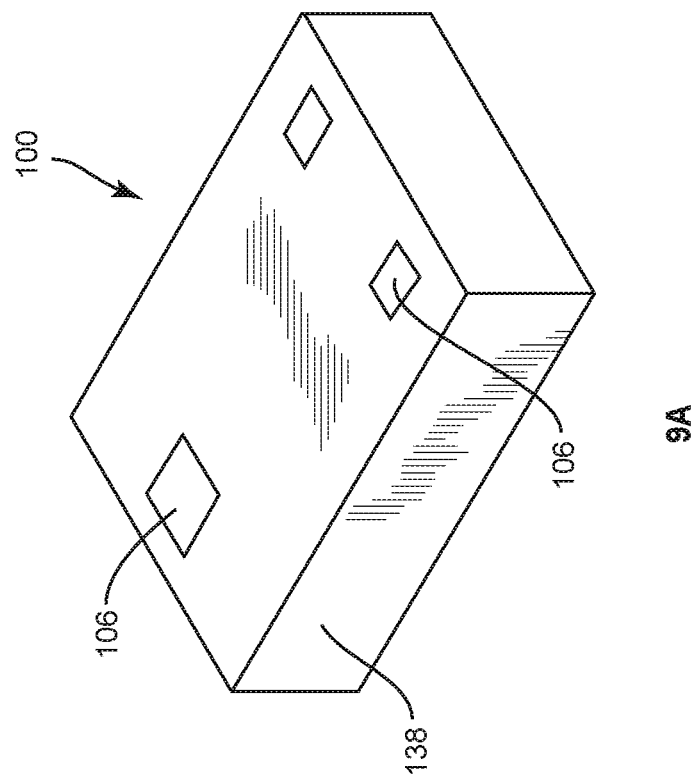
FIGURE 9

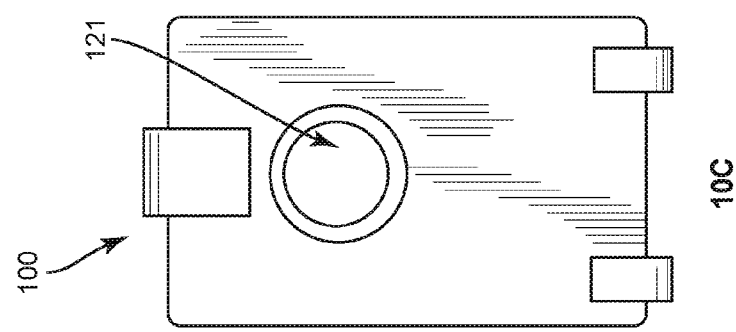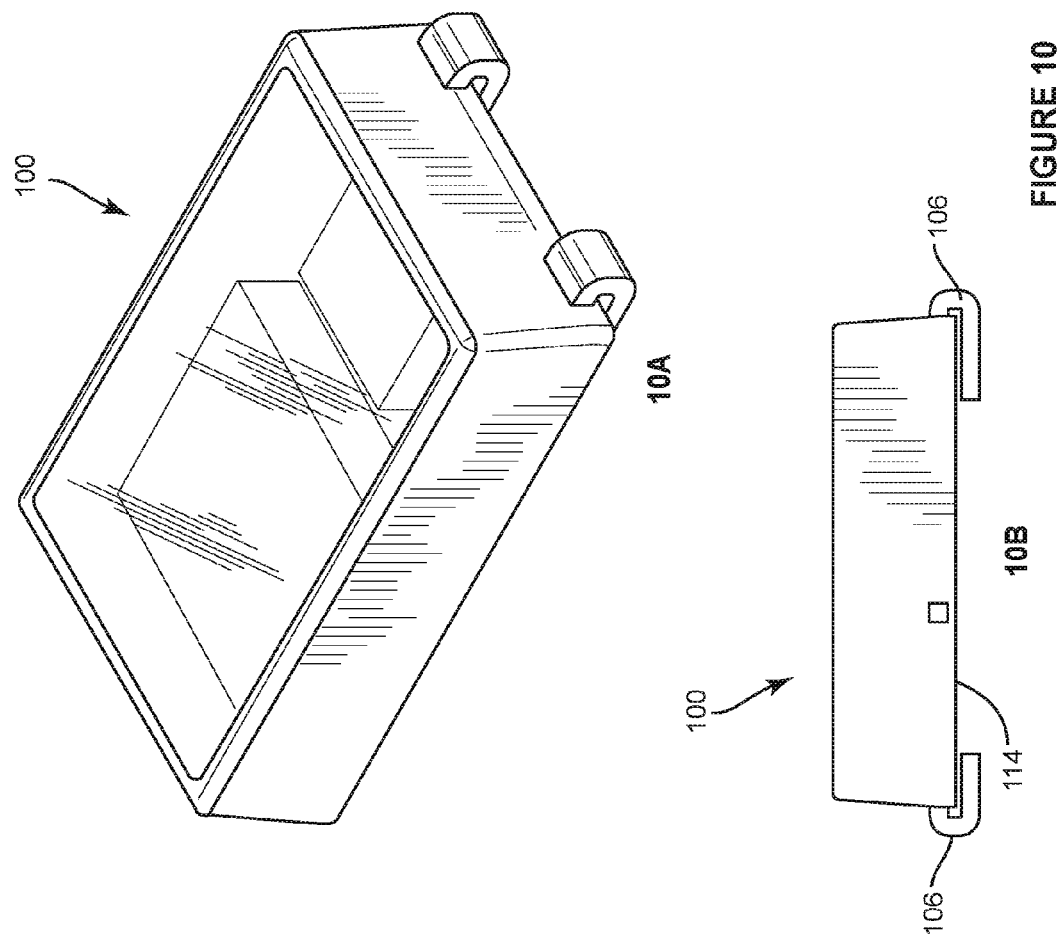
FIGURE 10

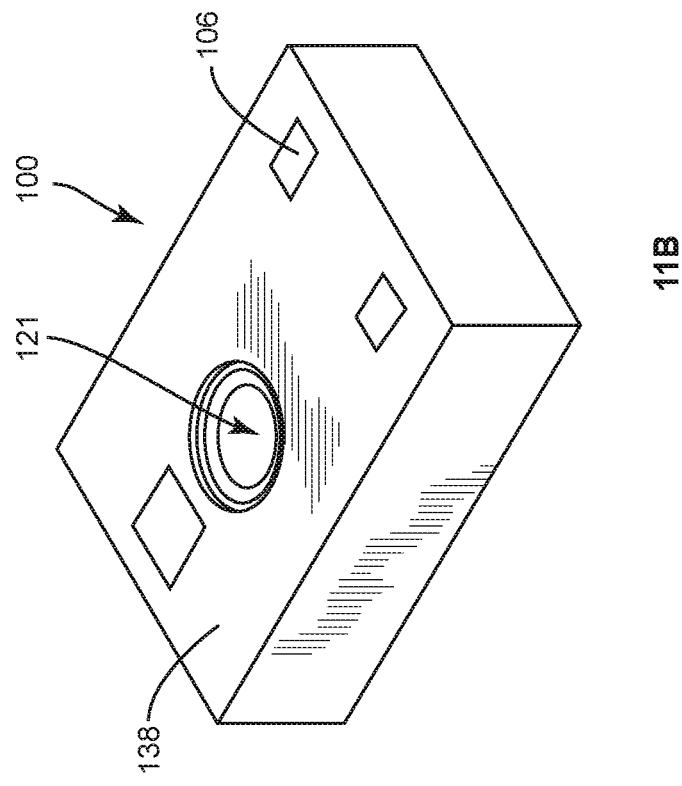
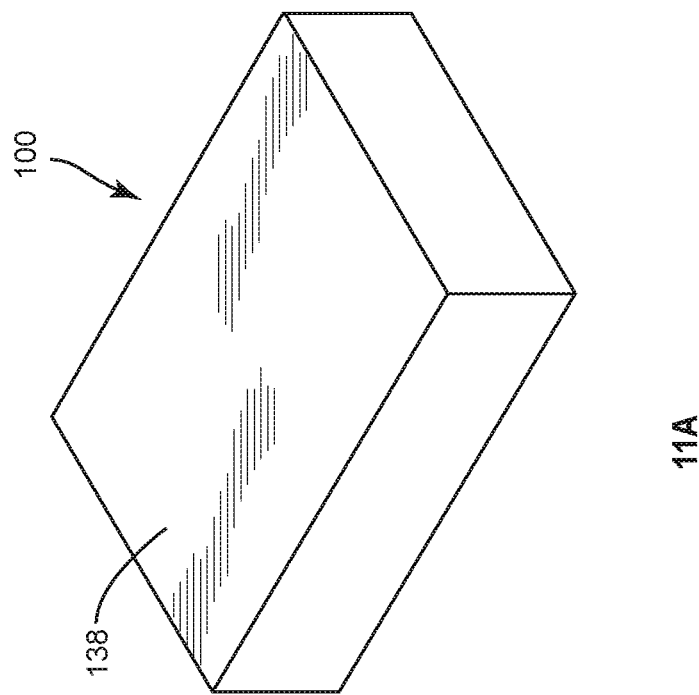
FIGURE 11

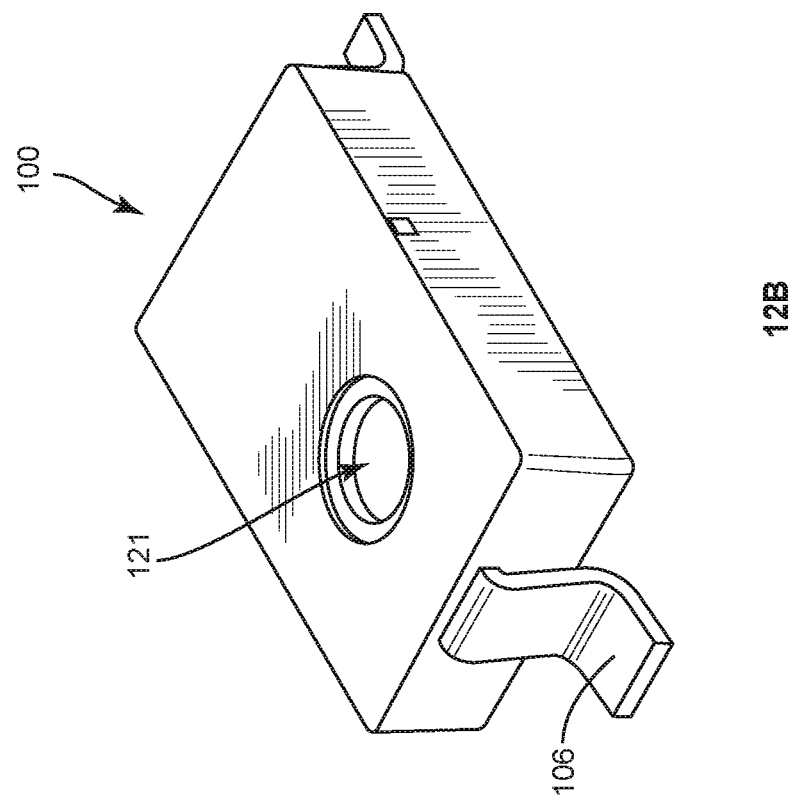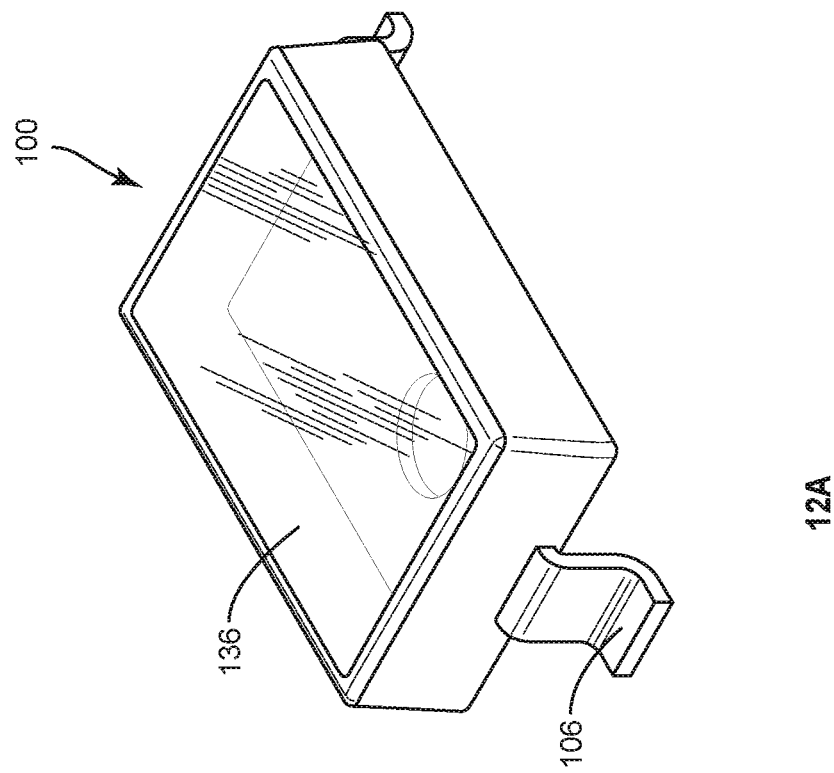
FIGURE 12

MOLDED PACKAGE STRUCTURE WITH GLUE BLEED STOPPER FOR SEALING A MEMS DEVICE METHOD OF PACKAGING A MEMS DEVICE

TECHNICAL FIELD

The instant application relates to semiconductor packaging, and more particularly relates to MEMS packages that provide high quality acoustic performance and are compatible with a wide variety of circuit boards.

BACKGROUND

Semiconductor packages are commonly used to house and protect integrated circuits, such as controllers, ASIC devices, sensors, etc. Semiconductor packaging should protect the integrated circuit from potentially damaging environmental conditions, such as extreme temperature variations, moisture, dust particles, etc. Packaging of sensor devices, such as MEMs (micro-electromechanical systems) sensor devices presents unique challenges. MEMs devices are commonly used to measure environmental parameters such as temperature, pressure, sound, composition of atmosphere, etc. The sensor elements require at least partial exposure to the exterior environment so that the environmental parameter can be measured, while the other circuits associated with the sensor elements should ideally be protected from the exterior environment. Accordingly, a MEMs package may include a roof or lid that protects the packaged items with an opening or port that exposes the MEMs sensor device to the exterior environment.

Particularly with regard to the packaging of acoustic MEMs devices (i.e., sensor devices having microphones), the performance of the MEMs device is highly dependent upon how well the microphone of the MEMs device can be positioned in the package structure. For example, in the case of a cavity-type package, larger background volumes of the interior cavity typically provide better performance. Further, for optimal performance, the MEMs device should ideally be placed as close to the port as possible.

Another design consideration in semiconductor packaging relates to the orientation of the package, relative to the article to which the package is connected (e.g., a global printed circuit board). In the case of MEMs applications, some users prefer the package to be mounted with the sound port facing downward towards the circuit board to which the package is electrically interfacing with. Other users prefer a reverse orientation of the sound port such that the MEMs device and port are opposite from the circuit board to which the package is electrically interfacing with.

One known package structure and associated technique for packaging MEMs devices involves the formation of PCB (printed circuit board) within the device package. The PCB allows for easy interconnection between the MEMs device and other devices contained within the package (e.g., ASIC devices). Further, two PCB layers can be provided in a single package to achieve a configuration in which the MEMs device and ASIC are on an opposite side of the package as the PCB layer in the package that is connected to the (global) circuit board to which the package is electrically interfacing with. This construction increases material costs and requires a high degree of precision during manufacturing. Although this can be avoided by only using one layer of PCB and mounting the MEMS device to this layer in either configuration, this option results in decreased performance for some configurations. Utilizing PCB within the package therefore suffers from the drawback of decreased compatibility and increased manufacturing costs.

SUMMARY

A semiconductor package is disclosed. According to an embodiment, the semiconductor package includes an electrically conductive lead-frame, including a first die paddle having a first opening, and a plurality of electrically conductive leads. The package further includes a ridge formed around a perimeter of the first opening, and an electrically insulating molding compound. The electrically insulating molding compound includes an interior cavity being defined by a planar base surface and outer sidewalls of the molding compound, a second opening formed in the base surface, and an interior sidewall being arranged within the interior cavity. The molding compound is formed around the lead-frame with the first die paddle arranged in the interior cavity. The first and the second openings are aligned with one another so as to form a port that provides access to the interior cavity. The ridge and the interior sidewall collectively form a dam that is configured to collect liquefied sealant and prevent the liquefied sealant from overflowing into the port or into adjacent regions of the interior cavity.

According to another embodiment, the semiconductor package includes an electrically conductive lead-frame, including a first die paddle having a first opening, and a plurality of electrically conductive leads. The package further includes a ridge formed around a perimeter of the first opening, and an electrically insulating molding compound. The electrically insulating molding compound includes an interior cavity being defined by a planar base surface and outer sidewalls of the molding compound, a second opening formed in the base surface, and an interior sidewall being arranged within the interior cavity. The package further includes a first semiconductor device arranged in the interior cavity and electrically connected to the lead-frame, and a sealant adhesively bonding the first semiconductor device to the lead-frame. The first and the second openings are aligned with one another so as to form a port that provides access to the interior cavity. The first semiconductor device is arranged in the interior cavity over the port. The sealant is contained by a dam that is collectively formed by the ridge and the interior sidewall.

A method of packaging a semiconductor device is disclosed. According to an embodiment, the method includes providing electrically conductive lead-frame, comprising a first die paddle having a first opening, a plurality of electrically conductive leads, and a ridge around a perimeter of the first opening. The method further includes forming an electrically insulating molding compound around the lead-frame such that the first die paddle is arranged within an interior cavity of the molding compound, the interior cavity being defined by a planar base surface and outer sidewalls of the molding compound. The method further includes forming a second opening in the base surface that is aligned with the first opening such that the first and second openings form a port that provides access to the interior cavity, and forming an interior sidewall that is arranged within the interior cavity. The ridge and the interior sidewall collectively form a dam that is configured to collect liquefied sealant and prevent the liquefied sealant from overflowing into the port or into adjacent regions of the interior cavity.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A and 1B, illustrates an electrically conductive lead frame, according to an embodiment. FIG. 1A depicts the lead from a plan view perspective, and FIG. 1B illustrates the lead frame from an isometric perspective.

FIGS. 2A and 2B, illustrates a plan view of a package including a lead frame and a molding compound, according to an embodiment. FIG. 2A depicts an outer side of the package, and FIG. 2B depicts the interior cavity of the package.

FIG. 3, which includes FIGS. 3A and 3B, illustrates an isometric view of the package of FIG. 2. FIG. 3A depicts an outer side of the structure and FIG. 3B illustrates the interior cavity of the package.

FIGS. 8A through 8C, illustrates the package after bending the leads to provide a port facing up configuration, according to an embodiment. FIG. 8A depicts the package from an isometric perspective, FIG. 8B depicts the package from a cross sectional perspective, and FIG. 8C depicts the package from a plan view perspective.

FIG. 9, which includes FIGS. 9A and 9B, illustrates the port facing up package configuration of FIG. 8 after performing an overmolding process, according to an embodiment.

FIG. 10, which includes FIGS. 10A through 10C, illustrates the package after bending the leads to provide a port facing down configuration, according to an embodiment. FIG. 10A depicts the package from an isometric perspective, FIG. 10B depicts the package from a cross sectional perspective, and FIG. 10C depicts the package from a plan view perspective.

FIG. 11, which includes FIGS. 11A and 11B, illustrates the port facing down package configuration of FIG. 10 after performing an overmolding process, according to an embodiment.

FIG. 12, which includes FIGS. 12A and 12B, illustrates the package after bending the leads without performing an overmolding process, according to an embodiment.

DETAILED DESCRIPTION

Embodiments of a semiconductor package and a corresponding semiconductor packaging method are disclosed. The package offers high performance in MEMs applications, for example, due to a liquefied sealant dam within the package. The dam is formed by the combination of a ridge shaped glue bleed stopper and an interior sidewall of the package cavity. These features collectively form a dam that constrains liquefied sealant underneath the MEMS device and therefore constrains the sealant to provide a perfect or near perfect acoustic seal between the MEMS device and the port of the package.

The packaging method can be carried out such that the basic package structure is universally compatible with a variety of mounting configurations, such as a "port facing up" configuration or a "port facing down" configuration. Different final package configurations can be achieved by simple changes to the manufacturing process, such as bending of the leads in different directions to achieve the "port facing up" configuration or the "port facing down" configuration.

One advantageous embodiment described herein includes providing an electrically conductive lid over the interior cavity of the package. The lid can be made electrically conductive by an electroless plating process, for example. The lid can be electrically connected to a ground terminal of the device by simply bending one of the leads against the surface of the lid and providing an electrical adhesive material between the two. By electrically grounding the lid, the lid can be configured as an EMI (electromagnetic interference) shield. The electroless plating process and lead bending process that are used to form this EMI shield are relatively inexpensive to implement in comparison to prior art package shielding techniques. For example, in conventional surface mount technology, additional metal is required to provide an EMI shield. This additional metal increases cost and processing expense.

FIGS. 1-12 depict a package 100 during various stages of a method of packaging a semiconductor device, according to an embodiment.

Figure 1:
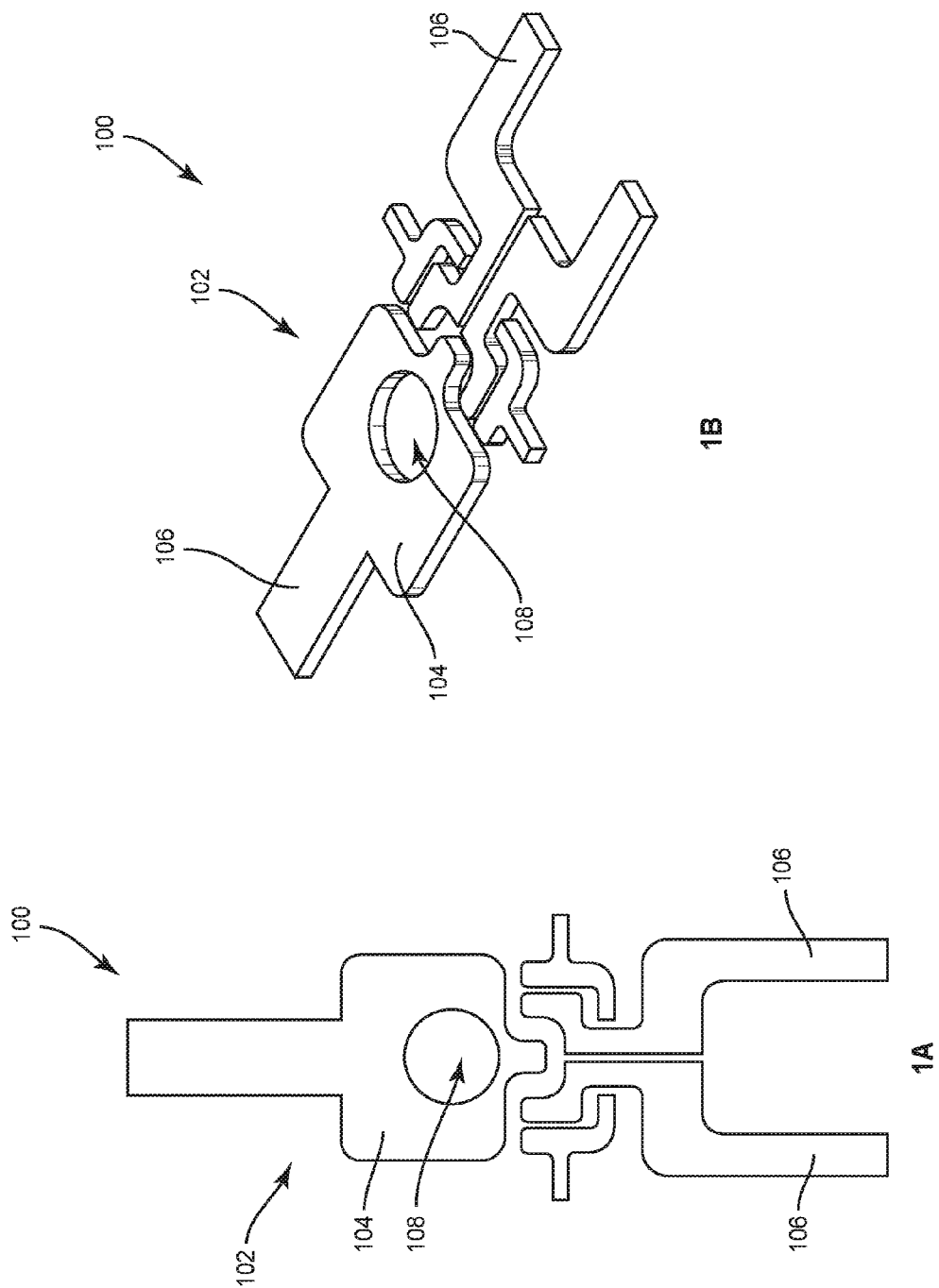
FIG. 1, which includes

FIG. 1, which includes FIGS. 1A and 1B, illustrates a lead-frame 102, according to an embodiment. The lead-frame 102 is formed from an electrical conductor such as copper, aluminum, or any suitable alloys or combination thereof. According to one embodiment, the lead-frame 102 is formed by providing a sheet layer of electrically conductive material (e.g., copper, aluminum, etc.) and by forming openings in the sheet metal, e.g., by stamping or etching.

The lead-frame 102 includes one or more die paddles 104. The die paddles 104 are dimensioned for the mounting of a semiconductor device thereupon. The lead-frame 102 further includes a plurality of leads 106 that extend away from the die paddles 104. According to an embodiment, the leads 106 are coplanar with the plane of the die paddle 104.

According to an embodiment, a first opening 108 is provided in the die paddle 104 of the lead-frame 102. The first opening 108 provides open communication between a semiconductor device that is mounted on the die paddle 104 and an opposite facing side of the lead-frame 102. As shown in FIG. 1, the first opening 108 has a circular shape. The size and shape of the first opening 108 can be tailored to the particular dimensions of the semiconductor device that is mounted to the die paddle 104.

Figure 2:
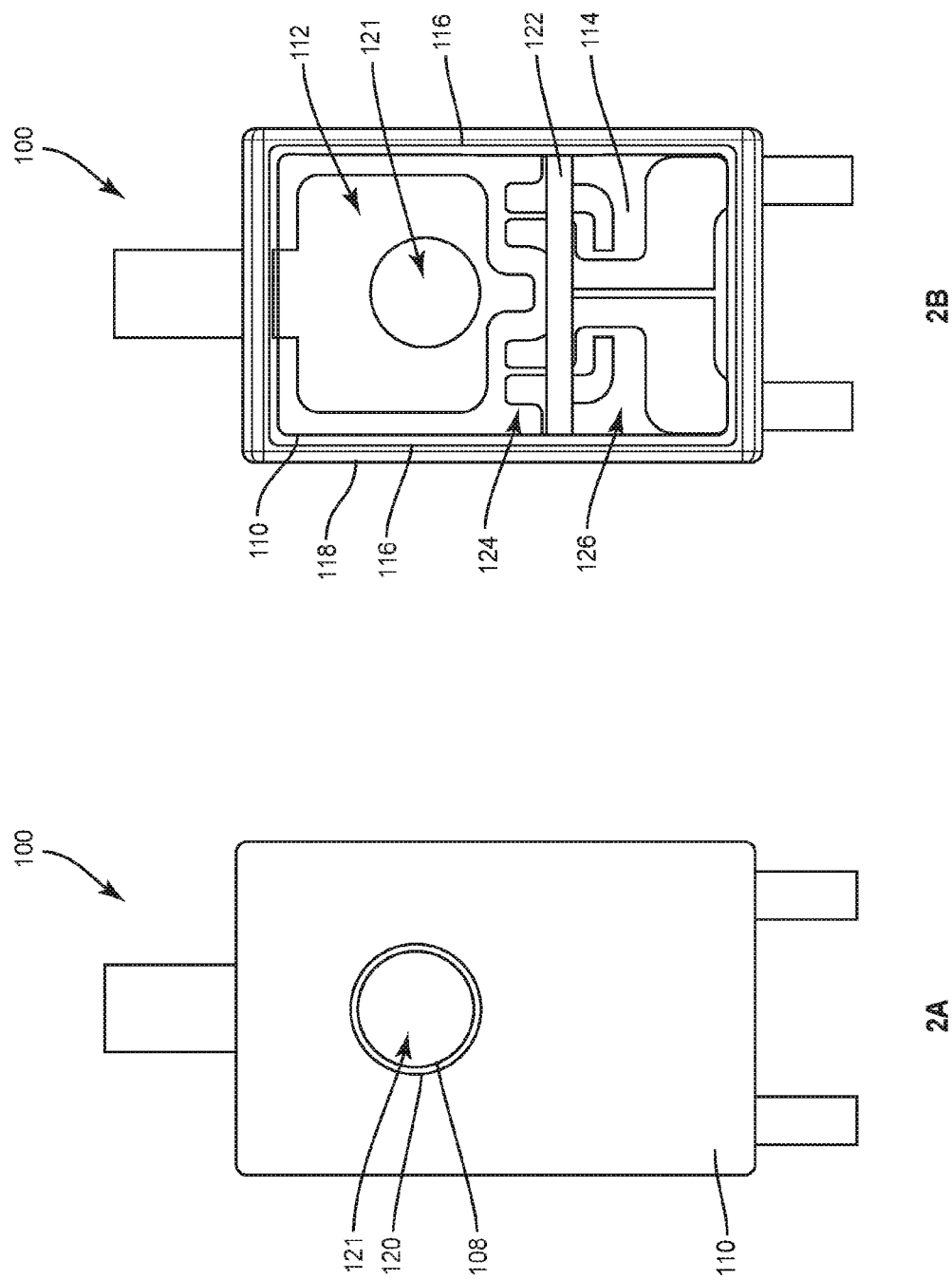
FIG. 2, which includes

FIG. 2, which includes FIGS. 2A and 2B, and FIG. 3, which includes FIGS. 3A and 3B, illustrate a universally configurable package 100, according to an embodiment. The package 100 includes the lead-frame 102 of FIG. 1 with an electrically insulating molding compound 110 formed around the lead-frame 102. The molding compound 110 may be formed from any of a variety of molding techniques, such as injection or transfer molding. Further, the material of the molding compound 110 can be any of the variety of materials that are used by these molding techniques, such as a thermoset plastic. The molding compound 110 has been formed to include an interior cavity 112. That is, the package 100 is a molded cavity package.

The molding compound 110 includes a substantially planar base surface 114 and outer sidewalls 116 that define the interior cavity 112 of the package. That is, the base surface 114 and the outer sidewalls 116 at least partly enclose a three dimensional volume. According to an embodiment, the outer sidewalls 116 are perpendicular to the base surface 114. Alternatively, the outer sidewalls 116 may form an oblique angle with respect to the base surface 114. Further, the outer sidewalls 116 may be tapered so as to be thicker near the base surface 114 and thinner near top edges 118 of the outer sidewalls 116 that are opposite from the base surface 114.

The molding compound 110 has been molded around the lead-frame 102 such that the die paddle 104 is arranged in the interior cavity 112. That is, the die paddle 104 is located between the planar base surface 114 and the top edges 118 of the outer sidewalls 116. Further, as shown in the depicted embodiment, the die paddle 104 may be parallel to and flush against the base surface 114.

A second opening 120 is formed in the base surface 114 of the molding compound 110. The dimensions and configuration of the second opening 120 correspond to the dimensions and configuration of the first opening 108 in the lead-frame 102. That is, the second opening 120 has substantially the same shape (e.g., circle, square, etc.) as the first opening 108. Further, the second opening 120 may have a similar size as the first opening 108 (e.g., between 1-10% larger than the first opening 108). As a result, the first and second openings 108, 120 can be aligned with one another so as to form a port 121 that provides access to the interior cavity 112. In an embodiment in which the die paddle 104 is flush against the base surface 114, the first and second openings 108, 120 overlap with one another to form a single entry point into the interior cavity 112 from outside of the package 102.

The molding compound 110 includes an interior sidewall 122 that is arranged within the interior cavity 112. The interior sidewall 122 may have a substantially similar or identical structure as the outer sidewalls 116. For example, the interior sidewall 122 may have the same height as the outer sidewalls 116, and may have a similar tapered configuration. Further, the interior sidewall 122 may extend away from the base surface 114 at the same orientation (e.g., perpendicular or slightly oblique) relative to the base surface 114. According to an embodiment, the interior sidewall 122 extends between opposing ones of the outer sidewalls 116 so as to divide the interior cavity 112 into first and second interior volumes 124, 126. For example, in an embodiment in which the package 100 is rectangular shaped, the interior sidewall 122 extends between two parallel and spaced apart outer sidewalls 116 so as to form two distinct cubic volumes within the interior cavity 112. According to an embodiment, the interior sidewall 122 directly adjoins the lead-frame 102 so as to completely isolate the first and second interior volumes 124, 126 from one another. In another embodiment, the interior sidewall 122 directly adjoins the base surface 114 and protrudes through an opening the in the lead-frame 102 so as to completely isolate the first and second interior volumes 124, 126 from one another.

Figure 4:
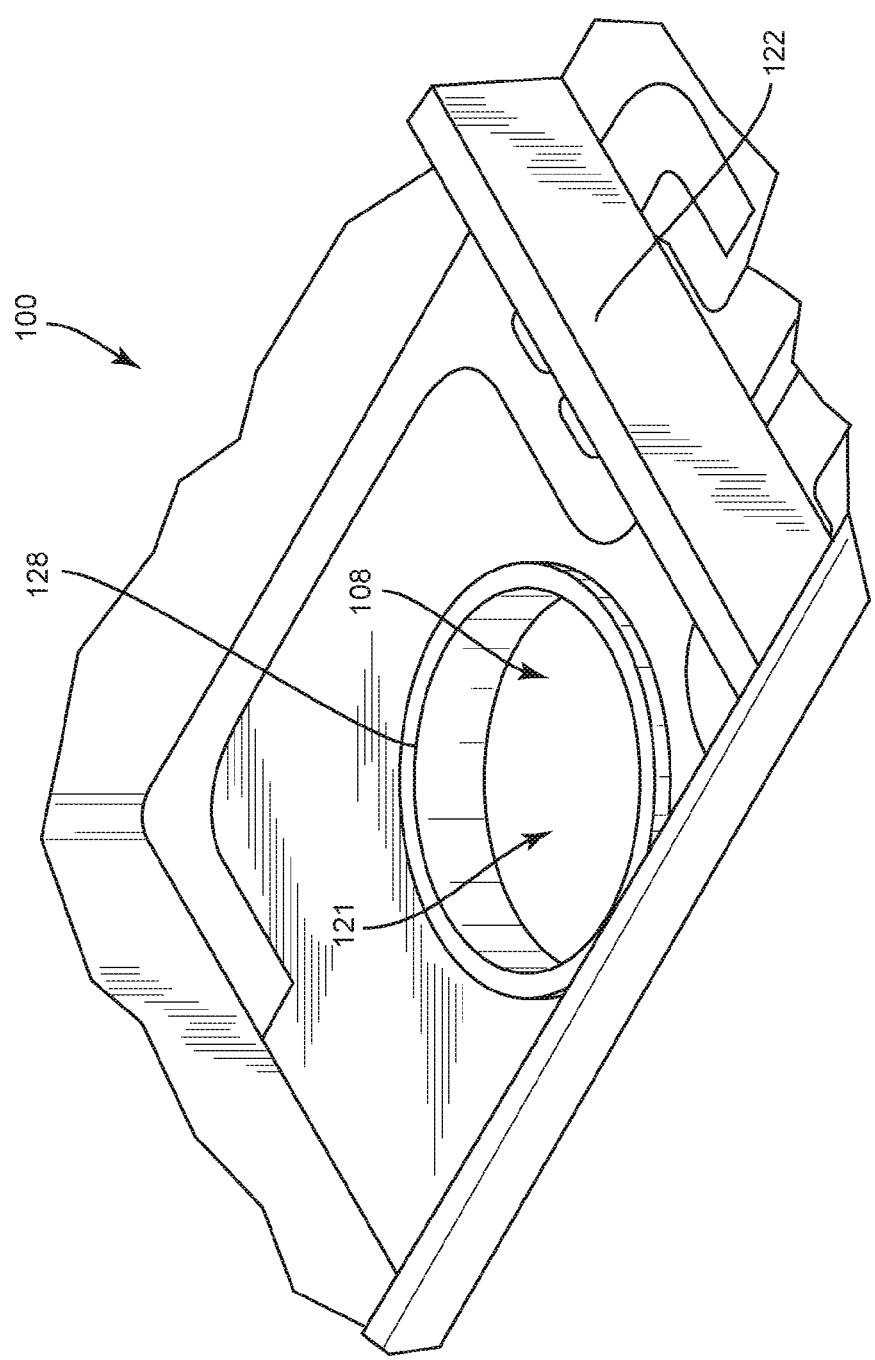
FIG. 4 illustrates a close-up isometric view of the package so as to illustrate the features of a ridge that is formed around an opening in the lead frame, according to an embodiment.

Referring to FIG. 4, a close up view of the package 100 is depicted from an isometric perspective so as to highlight the features of the package 100 near the first opening 108. As can be seen, the package 100 includes a ridge 128 formed around a perimeter of the first opening 108. The perimeter of the first opening 108 refers to the boundaries of the lead-frame 102 that define the shape of the first opening 108. The ridge 128 is an intentionally formed feature of the package 100 that is discrete from the other package features described herein, including, but not limited to, the interior sidewall 122 and the outer sidewalls 116.

The ridge 128 may be formed in either one or both of the lead-frame 102 and the molding compound 110. According to an embodiment, the ridge 128 is formed in the lead-frame 102 by a raised collar in the die paddle 104 that forms the perimeter of the first opening 108. The raised collar extends away from the first die paddle and towards the top edges 118 of the outer sidewalls 116 such that top edges of the raised collar are closer to the top edges 118 of the outer sidewalls 116 than the die paddle 104. According to an embodiment, the ridge 128 is perpendicular to the die paddle 104.

According to another embodiment, the ridge 128 is formed by a raised collar in the molding compound 110 (depicted in FIG. 6) that forms the perimeter of the second opening 120. In this embodiment, the ridge 128 is directly adjacent the second opening 120 such that inner sidewalls of the ridge 128 form the perimeter of the second opening 120.

Figure 5:
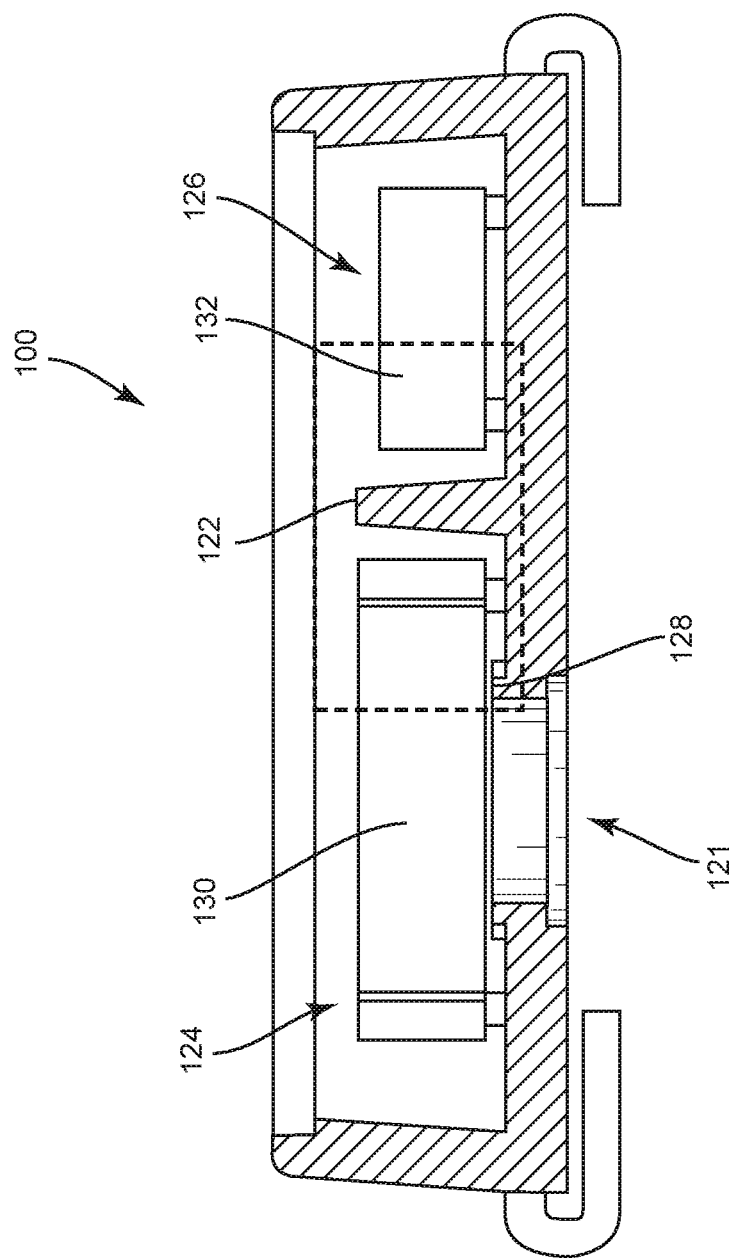
FIG. 5 illustrates a cross sectional view of the package with first and second semiconductor devices being mounted within the package, according to an embodiment.

Referring to FIG. 5, a first semiconductor device 130 has been mounted in the interior cavity 112 and electrically connected to the lead-frame 102. The first semiconductor device 130 may be any of a variety of integrated circuit devices, such as a switching device, logic device, memory, controller, sensor, etc. According to an embodiment, the first semiconductor device 130 is a MEMs device. More particularly, the first semiconductor device 130 may be an acoustic MEMs device that includes a microphone.

In the embodiment of FIG. 5, the first semiconductor device 130 has been flip chip mounted to the lead-frame 102, with an electrically conductive solder ball (e.g., a copper solder ball) physically and electrically connecting the two together. Alternatively, the orientation of the first semiconductor device 130 may be reversed with the terminals facing away from the lead-frame 102. In this embodiment, the electrical connection may be provided by wire bonds, for example.

The first semiconductor device 130 has been mounted over the port 121 such that at least a section of the first semiconductor device 130 is in open communication with the outside of the package via the port 121. According to an embodiment, the first semiconductor device 130 is flush against the ridge 128 that is formed around the perimeter of the first opening 108 such that a section of the semiconductor device 130 is exposed from the interior cavity 112.

According to an embodiment, a second semiconductor device 132 has been mounted in the interior cavity 112 and electrically connected to the lead-frame 102. As shown in FIG. 5, the first semiconductor device 130 has been mounted in the first interior volume 124 and the second semiconductor device 132 has been mounted in the second interior volume 126. The first and second semiconductor devices 130, 132 are separated from one another by the interior sidewall 122. The second semiconductor device 132 may be any of a variety of integrated circuit devices, such as a logic device, power transistor, analog circuit, sensor, etc. According to an embodiment, the second semiconductor device 132 is an ASIC device. The second semiconductor device 132 may be physically mounted and electrically connected to the lead-frame 102 in a similar fashion as the first semiconductor device 130.

Figure 6:
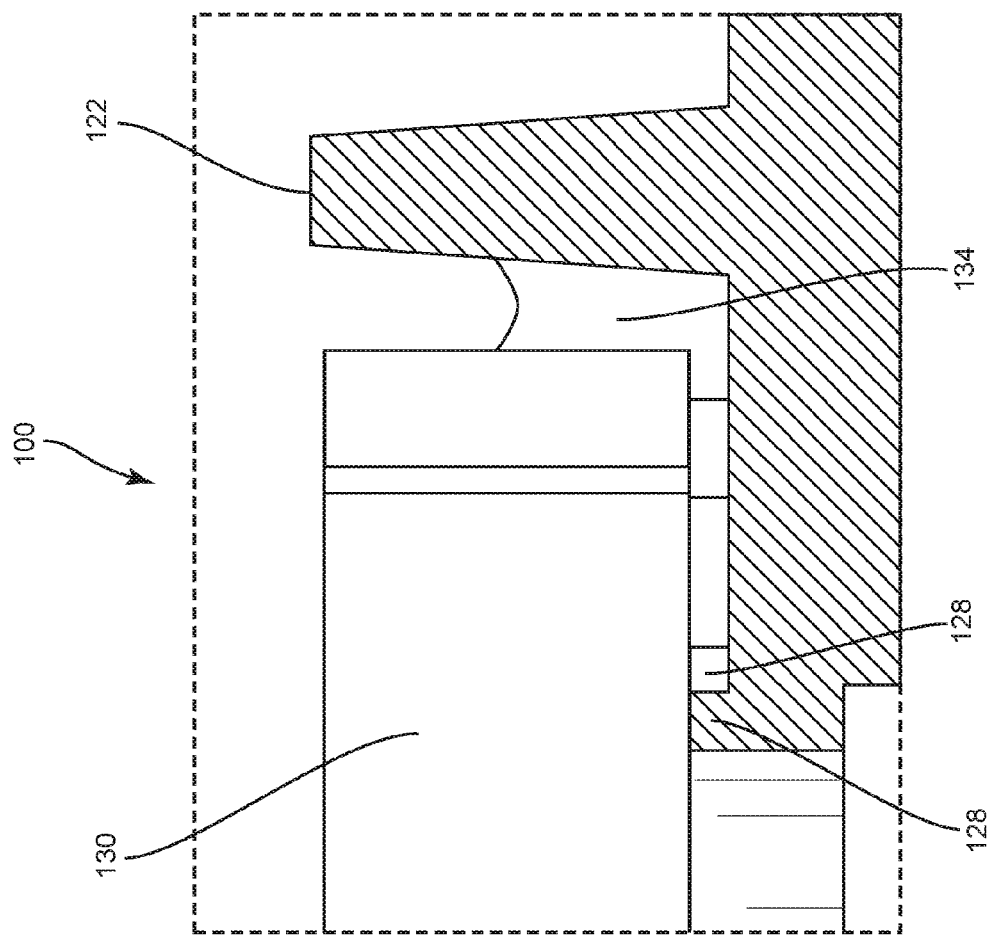
FIG. 6 illustrates a close-up cross sectional view of the package with sealant being injected underneath the first semiconductor device such that the sealant is contained by a dam structure, according to an embodiment.

Referring to FIG. 6, an adhesive bond between the first semiconductor device 130 and the package is formed using a sealant. The adhesive bond is formed by injecting liquefied sealant 134, such as MEMs glue (e.g., SU-8 or benzocyclobutene (BCB)) into the first interior volume 124 underneath the first semiconductor device 130. The ridge 128 and the interior sidewall 122 collectively form a dam structure. That is, the ridge 128 and the interior sidewall 122 form the opposing sidewalls that prevent the liquefied sealant 134 from laterally flowing across the base surface 114 and/or lead-frame 102. The dam therefore causes the liquefied sealant 134 that is injected into the first interior cavity 112 to gather around the port 121 and underneath the first semiconductor device 130. Further, the dam prevents the liquefied sealant 134 from bleeding into other regions where it can be problematic. For example, in the depicted embodiment, the liquefied sealant 134 is prevented from bleeding into the port 121 by the ridge 128. Further, the liquefied sealant 134 is prevented from bleeding into the second interior volume 126, which includes the second semiconductor device 132 and associated electrical connections, by the interior sidewall 122. Thus, a substantial amount of sealant 134 can be used provide a high quality adhesive bond between the first semiconductor device 130 and the package 100. Further, the sealant 134 can be used to form a seal between the first semiconductor device 130 and the port 121 that is impervious to sound transmission. Further, this adhesive bond can be formed at minimal processing expense, as the inclusion of the dam in the package structure mitigates the need to precisely control the amount of liquefied sealant 134 that is injected into the package 100.

According to an embodiment, the dam structure is used to guide the liquefied sealant 134 in such a way that the liquefied sealant 134 forms a complete seal around the port 121. As a result, a portion of the first semiconductor device 130 facing the port 121 is completely isolated from the interior cavity 112. That is, the sealant in conjunction with the ridge 128 encloses a portion of the bottom side of the first semiconductor device 130 that faces the port 121 such that this portion is only exposed to the outside of the package via the port 121.

A complete seal may be formed around the port 121 by injecting the liquefied sealant 134 underneath the first semiconductor device 130 (i.e., between the first semiconductor device 130 and the lead-frame 102) and completely around the first opening 108. In a package embodiment that includes the interior sidewall 122 dividing the interior cavity 112 into the first and second interior volumes 124, 126, the liquefied sealant 134 may be injected into the first interior volume 124 underneath the first semiconductor device 130 such that the liquefied sealant 134 is between the ridge 128, the interior sidewall 122 and sections of the outer sidewalls 116 in the first interior volume 124. That is, the sections of the outer sidewalls 116 in the first interior volume 124 can be also used as part of the dam structure. As a result, the liquefied sealant 134 can be provided throughout the first interior volume 124 and completely around the port 121. This technique may be particularly advantageous in an embodiment in which the first semiconductor device 130 is a MEMs device that includes a microphone. The MEMs device can be mounted to the die paddle 104 with the microphone facing the port 121. The injection of the sealant and corresponding sealant configuration that completely surrounds the port 121 allows the front volume of the MEMs device, which includes the microphone, to be completely acoustically isolated from its back volume, which faces the interior cavity.

Figure 7:
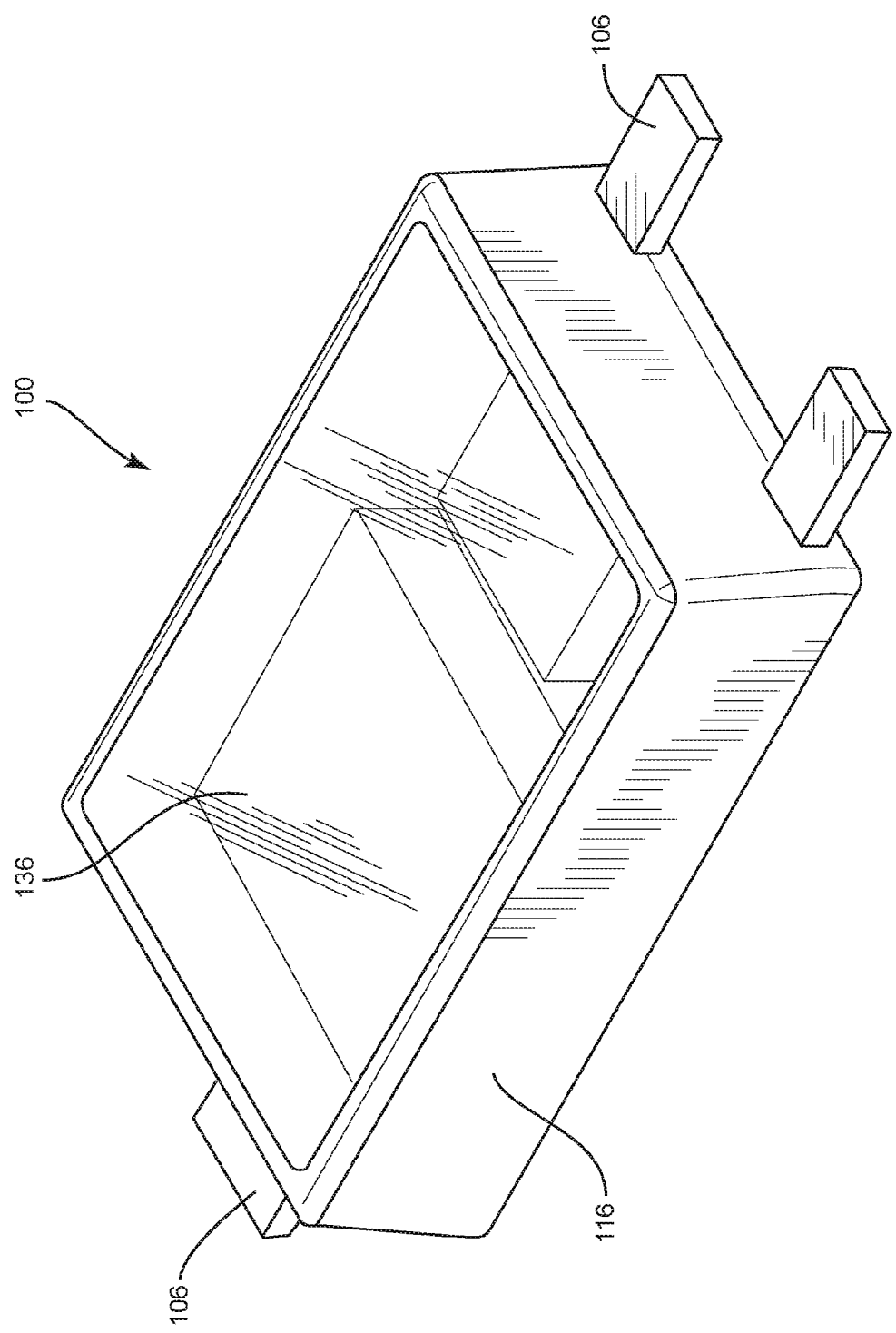
FIG. 7 illustrates an isometric view of the package with a lid placed over the cavity so as to enclose semiconductor devices contained therein, according to an embodiment.

Referring to FIG. 7, a lid 136 has been attached to the outer sidewalls 116 over the interior cavity 112 so as to enclose the devices contained within the interior cavity 112. The lid 136 is dimensioned in a corresponding fashion as the perimeter of the outer sidewalls 116 such that the lid 136 completely covers the outer sidewalls 116. Thus, the lid 136 can close off the interior cavity 112 such that the devices contained within the interior cavity 112 are only exposed to the outside of the package structure via the port 121. For example, if a complete seal has been formed around the port 121 in the manner described above, the only thing that is exposed to the outside of the package (when the lid 136 has been placed on the outer sidewalls 116) is a portion of the bottom side of the first semiconductor device 130 that faces the port 121.

According to an embodiment, the lid 136 has been plated with an electrically conductive coating. Exemplary coating materials include copper, nickel and aluminum. The lid 136 may be plated using an electroless plating process, for example. Further, this process may be performed prior to attaching the lid 136 to the package 100. Instead of forming the lid 136 from a conductor, the lid 136 may be formed from an electrically insulating material, such as plastic, ceramic, etc.

As shown in FIG. 7, the molding compound 110 has been formed around the lead-frame 102 such that the leads 106 extend through the outer sidewalls 116 to an outside of the package 100. That is, the leads 106 extend from the interior cavity 112 and penetrate the molding compound 110 such that exposed ends of the leads 106 are outside of the interior cavity 112. According to an embodiment, the leads 106 are parallel to the base surface 114 as they exit the outer sidewalls 116. The leads 106 have been electrically connected to the terminals of the devices stored within the package (e.g., the first and second semiconductor devices 130, 132) and therefore form the package level terminals for the device. The package structure shown in FIG. 5 is compatible with a wide variety of receiving components (e.g., circuit boards). Exemplary lead configurations and corresponding processes that are performed to tailor the package to a particular receiving component will now be discussed with reference to FIGS. 8-12.

Figure 8:
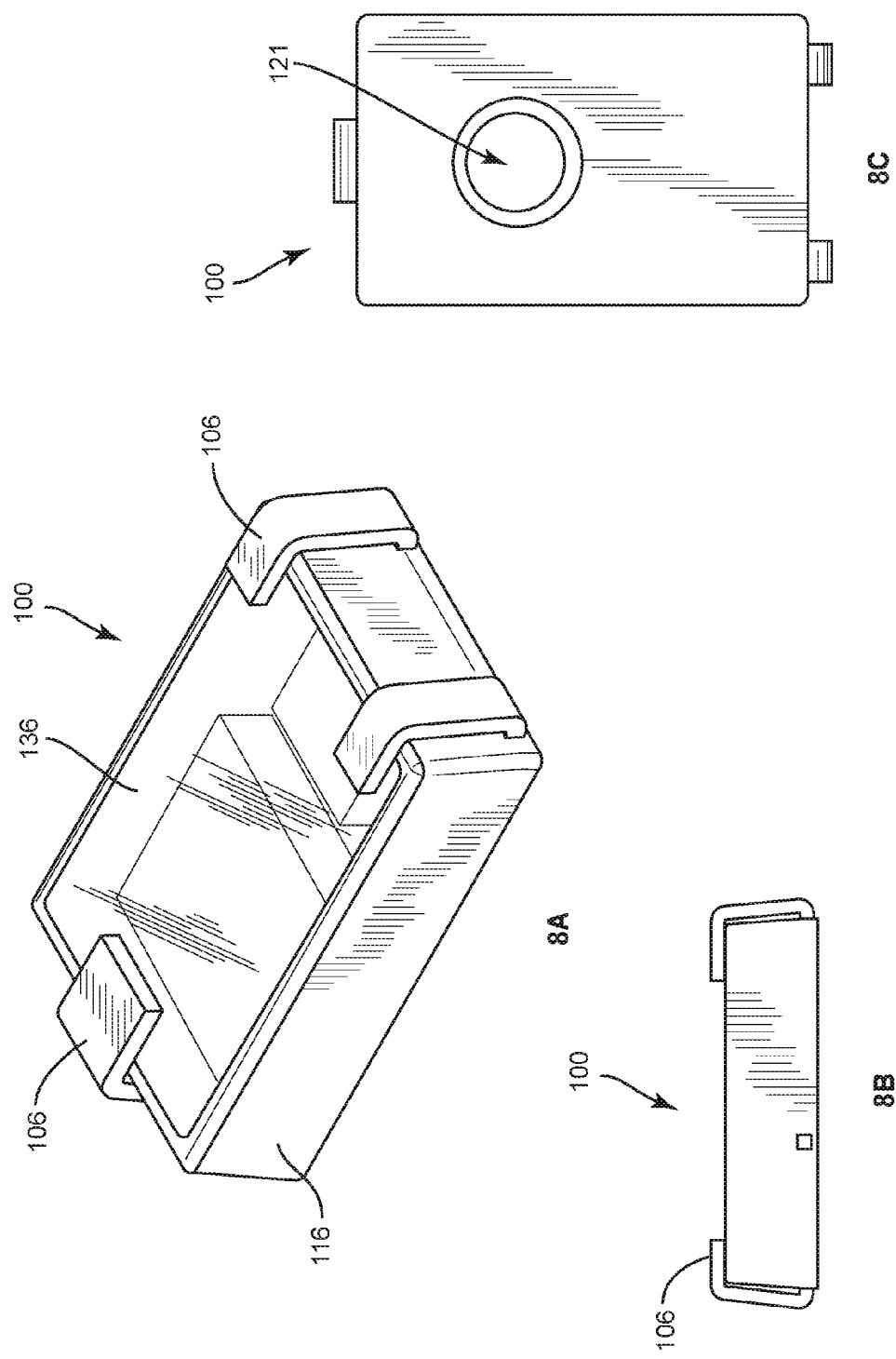
FIG. 8, which includes

FIG. 8, which includes FIGS. 8A through 8C, depicts the leads 106 being bent to provide a "port facing up" configuration of the package 100. In this embodiment, the portions of the leads 106 that are outside of the interior cavity 112 have been bent around the molding compound 110. That is, the leads 106 are angled around the corners of the package 100. More particularly, the leads 106 are bent away from the base surface 114 and towards the lid 136 such that end portions of the leads 106 are flush against the lid 136. Further, middle portions of the leads 106 between the end portions and the outer sidewalls 116 are flush against the outer sidewalls 116. According to an embodiment, at least one of the leads 106 is electrically connected to the lid 136 and also forms a ground terminal of the package 100. The lead 106 that is electrically connected to the lid 136 may also be connected to ground terminals of the first and second semiconductor devices 130, 132. In this embodiment, the lid 136 may be coated with the electrically conductive coating in the manner described above. The connection between the ground lead 106 and the lid 136 may be effectuated by applying a conductive adhesive between the lead 106 and the coating, for example. The conductive adhesive may be a conductive epoxy or solder paste, for example. This configuration provides an electromagnetic interference (EMI) shield for the package 100, as potentially hazardous electromagnetic fields outside of the interior cavity 112 are prevented from influencing the operation of the semiconductor devices stored within the package 100.

FIG. 9, which includes FIGS. 9A and 9B, depicts the package 100 of FIG. 8 after an overmolding process has been applied to the package 100. According to this process, an overmold 138 has been formed around the original molding compound 110. This overmold 138 may be formed by a transfer molding process, for example. The overmold 138 is formed such that the bent portions of the leads 106 that are outside of the interior cavity 112 are covered by the overmold 138. That is, exposed portions of the leads 106 are overmolded. However, end portions of the leads 106 are uncovered from the overmold 138. The port 121 is also exposed from the overmold 138.

The terminals of the package 100 are formed by the flat portions of the leads 106 that are exposed from the overmold 138. As can be seen, the overmolding of FIG. 9 produces a so-called "leadless" package in which the terminals do not protrude away from the planar outer surfaces of the package 100. The package 100 of FIG. 9 can be mounted and electrically connected (e.g., by soldering) to an external apparatus such as a PCB with the terminals facing and electrically connected to the external apparatus. The port 121, which is opposite from the terminals, will face away from the external apparatus in this configuration.

FIG. 10, which includes FIGS. 10A through 10C, depicts the package 100 with the leads 106 being bent to provide a "port facing down" configuration. In the configuration of FIG. 10, the leads 106 have been bent in the opposite direction as the configuration of FIGS. 8-9. That is, the portions of the leads 106 that are outside of the interior cavity 112 have been bent towards the base surface 114 such that end portions of the leads 106 are flush against the base surface 114. Instead of being flush, the leads 106 may be separated from the base surface 114 by a small distance.

Referring to FIG. 11, an overmolding process has been performed on the package of FIG. 10. This overmolding process may be substantially similar or identical to the overmolding process described above with reference to FIG. 9. That is, the bent portions of the leads 106 that are outside of the interior cavity 112 are overmolded so as to form a so-called "leadless" package. The package 100 of FIG. 11 can be mounted and electrically connected (e.g., by soldering) to an external apparatus such as a PCB with the terminals facing and electrically connected to the external apparatus. The port 121, which is arranged on the same side of the package 100 as the terminals, will face towards the external apparatus in this configuration.

FIG. 12 depicts a package 100 that may be formed according to another embodiment. The package 100 of FIG. 12 can be formed by omitting the overmolding steps described with reference to FIGS. 9-11 and subsequently bending the leads 106. According to the method, a package 100 that is substantially similar or identical to the package 100 of FIG. 8 is provided and the leads 106 are subsequently bent in a desired direction. For example, as shown in FIG. 12A, the leads 106 may be bent downwards towards the base surface 114 such that end portions of the leads 106 are spaced closer to the port 121. In this way, the package can be mounted, e.g., to a PCB, with the port 121 facing the PCB. That is, the package of FIG. 12A is a "port facing down" configuration. Alternatively, as shown in FIG. 12B, the leads 106 can be bent in the opposite direction to provide a "port 121 facing up" configuration.

The figures illustrate several examples of a wide variety of package constructions that are possible according to the present embodiments. The length of the leads 106 can be increased, decreased, trimmed, bent, etc. to achieve a desired terminal configuration, Further, the thickness of the overmold 138 can be tailored to meet different requirements for the overall size of the package 100.

One advantageous aspect of the embodiments described herein is the universal compatibility of the package structure. Starting with the package 100 of FIG. 8, a variety of different package constructions can be achieved by simple variations in the process, which are easy to implement. For example, the portions of the leads 106 that are outside of the package 100 can be bent in either direction such that such that end portions of the leads 106 are either disposed on the base surface 114 of the molding compound 110 portion or the lid 136. As a result, the "port facing up" and "port facing down" configurations can be realized by processes with an identical build of materials (BOM) by simply changing the trimming/forming tools to provide a desired bending profile of the package leads 106. By contrast, conventionally known package constructions that implement PCB within the package typically require different BOMs for the different configurations, e.g., two PCB layers for the "port facing up" configuration and one PCB layer for the "port facing down" configuration. The techniques described herein utilize the leads 106 and subsequent (optional) overmolding process to provide a simple and cost effective solution. Costly and time consuming PCB related steps, such as PCB attach and testing can be omitted from the process.

A further advantageous aspect of the embodiments described herein is the high quality and uniform sound capturing environment that is created for the MEMS device, regardless of whether the package is configured in a "port facing up" or in a "port facing down" configuration. Both configurations can have an interior cavity 112 with a standardized volume of 1.187 mm$^3$ or 2.5 mm$^3$, for example, as the molding process associated with either package construction is the same. By contrast, known packaging techniques that utilize PCB are unable to form a single volume in the "port facing up" or "port facing down" configurations.

Furthermore, in either the "port facing up" or "port facing down" configuration of the presently disclosed embodiments, the MEMS device can optionally be flip chip mounted with the microphone being acoustically isolated from the interior cavity 112. The features of the ridge 128 and the interior sidewall 122 ensure high performance, as a substantial amount of sealant can be used to form a seal between the MEMS device and the package that is physically durable and acoustically impenetrable.

The term "substantially" encompasses absolute conformity with a requirement as well as minor deviation from absolute conformity with the requirement due to manufacturing process variations, assembly, and other factors that may cause a deviation from the ideal. Provided that the deviation is within process tolerances so as to achieve practical conformity and the components described herein are able to function according to the application requirements, the term "substantially" encompasses any of these deviations.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor package, comprising:
   an electrically conductive lead-frame, comprising a first die paddle having a first opening, and a plurality of electrically conductive leads;
   a ridge formed around a perimeter of the first opening; and
   an electrically insulating molding compound, comprising an interior cavity being defined by a planar base surface and outer sidewalls of the molding compound, a second opening formed in the base surface, and an interior sidewall being arranged within the interior cavity;
   wherein the molding compound is formed around the lead-frame with the first die paddle arranged in the interior cavity,
   wherein the first and the second openings are aligned with one another so as to form a port that provides access to the interior cavity, and
   wherein the ridge and the interior sidewall collectively form a dam that is configured to collect liquefied sealant and prevent the liquefied sealant from overflowing into the port or into adjacent regions of the interior cavity.

2. The semiconductor package of claim 1, wherein the interior sidewall extends between opposing ones of the outer sidewalls so as to divide the interior cavity into first and second interior volumes, wherein the port feeds into the first interior volume, wherein the ridge is configured to prevent the liquefied sealant from flowing into the port, and wherein the interior sidewall is configured to prevent the liquefied sealant from flowing into the second interior volume.

3. The semiconductor package of claim 2, wherein the ridge is formed in the lead-frame and comprises a raised collar in the first die paddle that forms the perimeter of the first opening, the raised collar extending away from the first die paddle and towards top edges of the outer sidewalls.

4. The semiconductor package of claim 2, wherein the ridge is formed in the molding compound and comprises a raised collar in the base surface that forms the perimeter of the second opening, the raised collar extending away from the base surface and towards top edges of the outer sidewalls.

5. The semiconductor package of claim 1, further comprising a lid that is configured to be placed on top edges of the outer sidewalls on an opposite side of the packaging structure as the port so as to enclose the interior cavity such that the interior cavity is only accessible via the port, wherein the lid is plated with an electrically conductive coating that is configured to electromagnetically shield the interior cavity when the lid encloses the interior cavity.

6. A semiconductor package, comprising:
   an electrically conductive lead-frame, comprising a first die paddle having a first opening, and a plurality of electrically conductive leads;
   a ridge formed around a perimeter of the first opening;
   an electrically insulating molding compound, comprising an interior cavity being defined by a planar base surface and outer sidewalls of the molding compound, a second opening formed in the base surface, and
   an interior sidewall being arranged within the interior cavity;
   a first semiconductor device arranged in the interior cavity and electrically connected to the lead-frame; and
   a sealant adhesively bonding the first semiconductor device to the lead-frame,
   wherein the first and the second openings are aligned with one another so as to form a port that provides access to the interior cavity;
   wherein the first semiconductor device is arranged in the interior cavity over the port, and
   wherein the sealant is contained by a dam that is collectively formed by the ridge and the interior sidewall.

7. The semiconductor package of claim 6, wherein the sealant forms a complete seal around the port such that a portion of the first semiconductor device facing the port is completely isolated from the interior cavity.

8. The semiconductor package of claim 7, wherein the first semiconductor device is a MEMs device comprising a microphone that faces the port, and wherein the microphone is isolated from the interior cavity by the sealant which contacts the ridge, the interior sidewall, and the first die paddle.

9. The semiconductor package of claim 8, wherein the interior sidewall extends between opposing ones of the outer sidewalls so as to divide the interior cavity into first and second interior volumes, wherein the MEMs device is arranged in the first interior volume, and wherein the interior sidewall contains the sealant within the first interior volume.

10. The semiconductor package of claim 6, further comprising:
    a lid arranged on top edges of the outer sidewalls and enclosing the interior cavity such that the interior cavity is only accessible via the port,
    wherein the lid is plated with an electrically conductive coating,
    wherein one of the leads forms a ground terminal of the package that is electrically connected to the lid and to the first semiconductor device.

11. The semiconductor package of claim 10, wherein the leads extend from the interior cavity through the outer sidewalls in a direction that is parallel to the base surface, wherein the leads are bent around the outer sidewalls outside of the interior cavity such that end portions of the leads are either disposed on the base portion or the lid.

12. The semiconductor package of claim 11, wherein the leads are bent outside of the interior cavity towards the lid such that the end portions of the leads are flush against the lid, wherein a first one of the leads is electrically connected to the electrically conductive coating of the lid by a conductive adhesive and forms the ground terminal of the package.

13. The semiconductor package of claim 11, further comprising:
    an electrically insulating overmold that is formed around an outside of the molding compound and covers the bent portions that are outside of the interior cavity and extend between the outer sidewalls and the end portions of the leads,
    wherein the end portions of the leads and the port are exposed from the overmold.

14. A method of packaging a semiconductor device, comprising:
    providing an electrically conductive lead-frame, comprising a first die paddle having a first opening, and a plurality of electrically conductive leads, and a ridge around a perimeter of the first opening;

forming an electrically insulating molding compound around the lead-frame such that the first die paddle is arranged within an interior cavity of the molding compound, the interior cavity being defined by a planar base surface and outer sidewalls of the molding compound;

forming a second opening in the base surface that is aligned with the first opening such that the first and second openings form a port that provides access to the interior cavity;

forming an interior sidewall that is arranged within the interior cavity; and wherein the ridge and the interior sidewall collectively form a dam that is configured to collect liquefied sealant and prevent the liquefied sealant from overflowing into the port or into adjacent regions of the interior cavity.

15. The method of claim 14, further comprising:
mounting a first semiconductor device in the interior cavity over the port;
electrically connecting the first semiconductor device to the lead-frame;
forming an adhesive bond between the first semiconductor device and the lead-frame by injecting liquefied sealant into the interior cavity, wherein the dam prevents the liquefied sealant from flowing into an adjacent region of the interior cavity and gathers the liquefied sealant underneath the first semiconductor device, and wherein an outside of the molding compound is acoustically sealed from the interior cavity of the molding compound by the sealant; and
covering the outer sidewalls with a lid that is arranged over the interior cavity such that the first semiconductor device is only exposed to the outside of the molding compound via the port.

16. The method of claim 15, wherein the first semiconductor device is a MEMs device comprising a microphone, wherein the MEMs device is mounted to the first die paddle with the microphone facing the port, and wherein forming the adhesive bond comprises injecting the liquefied sealant underneath MEMs device and completely around the first opening such that a front volume of the microphone is isolated from a back volume of the microphone, wherein the liquefied sealant is prevented from bleeding into the port by the ridge, and wherein the interior sidewall prevents the liquefied sealant from bleeding into adjacent regions of the interior cavity.

17. The method of claim 16, wherein the interior sidewall extends between opposing ones of the outer sidewalls so as to divide the interior cavity into first and second interior volumes, wherein the port feeds into the first interior volume, and wherein the liquefied sealant is injected into the first interior volume underneath the first semiconductor device and collects between the ridge, the interior sidewall and sections of the outer sidewalls in the first interior volume.

18. The method of claim 15, wherein the lead-frame further comprises a plurality of electrically conductive leads extending away from the first die paddle, the method further comprising:
forming the electrically insulating molding compound around the lead-frame such that the leads extend from the interior cavity through the outer sidewalls in a direction that is parallel to the base surface; and
bending the leads outside of the interior cavity around the outer sidewalls such that end portions of the leads are either disposed on a same side of the molding compound as the port or disposed on an opposite side of the molding compound as the port.

19. The method of claim 18, wherein the lid is plated with an electrically conductive coating that electromagnetically shields the interior cavity, wherein bending the leads around the outer sidewalls comprises bending the leads away from the base surface such that the end portions of the leads are flush against the lid, the method further comprising:
electrically connecting the lid to a first lead of the plurality using a conductive adhesive, wherein the first lead is electrically connected to the first semiconductor device.

20. The method of claim 18, further comprising:
forming an electrically insulating overmold around the outside of the molding compound so as to cover bent portions of the leads extending between the outer sidewalls and the end portions of the leads with the overmold,
wherein the end portions of the leads and the port are exposed from the overmold, and
wherein bending the leads around the outer sidewalls comprises bending the leads towards the base surface such that the end portions of the leads are flush against the base surface.

* * * * *

UNITED STATES PATENT AND TRADEMARK OFFICE
CERTIFICATE OF CORRECTION

| | | |
|---|---|---|
| PATENT NO. | : 9,475,691 B1 | Page 1 of 1 |
| APPLICATION NO. | : 14/751316 | |
| DATED | : October 25, 2016 | |
| INVENTOR(S) | : Chua et al. | |

It is certified that error appears in the above-identified patent and that said Letters Patent is hereby corrected as shown below:

On the title page item [54] and in the specification, column 1, line 3, change "DEVICE METHOD" to -- DEVICE AND METHOD --

Signed and Sealed this
Twentieth Day of December, 2016

Michelle K. Lee
*Director of the United States Patent and Trademark Office*